(12) United States Patent
Yong et al.

(10) Patent No.: US 8,174,100 B2
(45) Date of Patent: May 8, 2012

(54) LIGHT SOURCE USING A LIGHT-EMITTING DIODE

(75) Inventors: Lig Yi Yong, Penang (MY); Siang Ling Oon, Bukit Mertajam (MY); Kean Loo Keh, Gelugor (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 46 days.

(21) Appl. No.: 12/235,388

(22) Filed: Sep. 22, 2008

(65) Prior Publication Data

US 2010/0072592 A1    Mar. 25, 2010

(51) Int. Cl.
*H01L 23/495* (2006.01)

(52) U.S. Cl. ......... 257/676; 257/E51.018; 257/E51.022; 257/E33.001; 257/E33.055; 257/E23.031

(58) Field of Classification Search .................. 257/676, 257/E33.001, 79–84, 95, 100, 184, 431–433, 257/444, E51.018, E51.022, E33.055, E31.099, 257/E31.105, 918, E23.031
See application file for complete search history.

(56) References Cited

U.S. PATENT DOCUMENTS

| | | | | |
|---|---|---|---|---|
| 6,943,380 | B2 * | 9/2005 | Ota et al. | 257/100 |
| 7,528,414 | B2 * | 5/2009 | Huang et al. | 257/79 |
| 7,547,583 | B2 * | 6/2009 | Ng et al. | 438/123 |
| 2006/0226435 | A1 * | 10/2006 | Mok et al. | 257/98 |
| 2007/0257272 | A1 * | 11/2007 | Hutchins | 257/98 |
| 2008/0079019 | A1 * | 4/2008 | Huang et al. | 257/99 |

* cited by examiner

*Primary Examiner* — A. Sefer
*Assistant Examiner* — Monica D Harrison

(57) ABSTRACT

A light source is described herein. An embodiment of the light source comprises a mounting surface and a first lead frame. The first lead frame extends from the mounting surface. The first lead frame comprises a first portion extending from the mounting surface; a cup portion having a cup portion first side and a cup portion second side, the cup portion first side configured to receive a light-emitting diode, the cup portion second side being located opposite the cup portion first side; and a second portion extending between the first portion and the cup portion second side.

8 Claims, 2 Drawing Sheets

LIGHT SOURCE USING A LIGHT-EMITTING DIODE

BACKGROUND

Some light sources use light-emitting diodes placed on leads or lead frames. The lead frames and the light-emitting diodes are encapsulated to protect the light-emitting diodes and other devices in the light source. The encapsulant keeps the components from becoming dislodged and keeps contaminants from adversely affecting the components.

One problem with light sources is that the encapsulant delaminates from components within the light source and/or cracks. The delamination and cracking may cause damage to components within the light source. The delamination and cracking may also enable contaminants to enter the light source and cause the components to fail.

DETAILED DESCRIPTION

Figure 1:
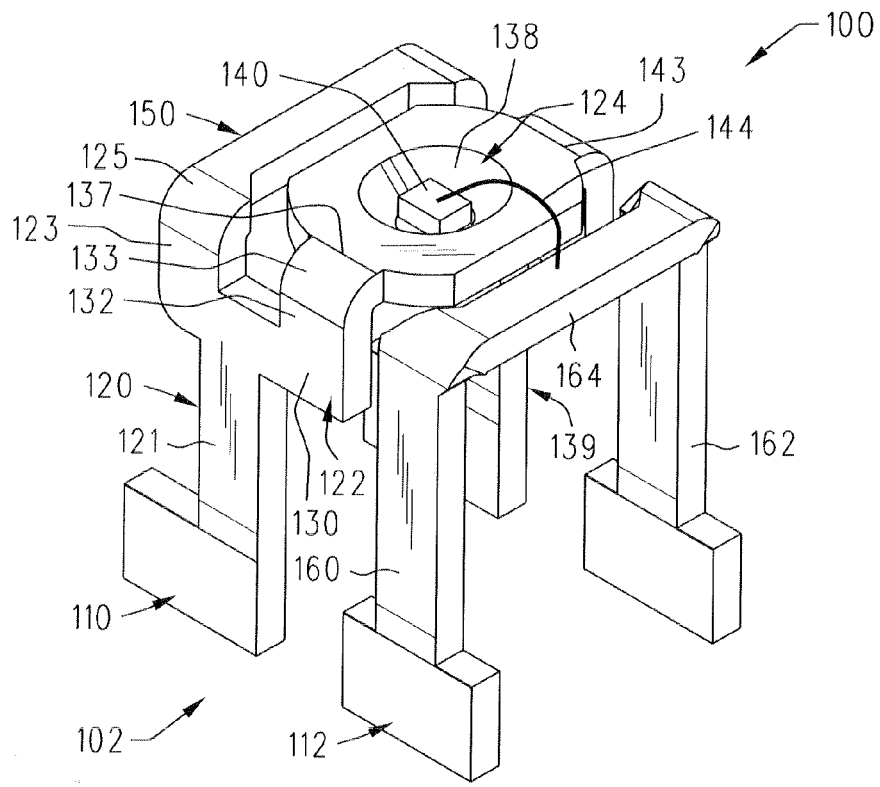
FIG. 1 is a top perspective view of a portion of an embodiment of a light source with the encapsulant removed.

FIG. 1 is a top perspective view of a portion of a light source 100. It is noted that the light source may be encapsulated by an encapsulant as described in greater detail below and which is not shown in FIG. 1. The light source 100 includes a first lead frame assembly 110 and a second lead frame assembly 112. During operation of the light source, current conducts between the first lead frame assembly 110 and the second lead frame assembly 112 as described in greater detail below. Accordingly, one lead frame assembly 110, 112 may be an anode lead and the other lead frame assembly 110, 112 may be a cathode lead.

Figure 2:
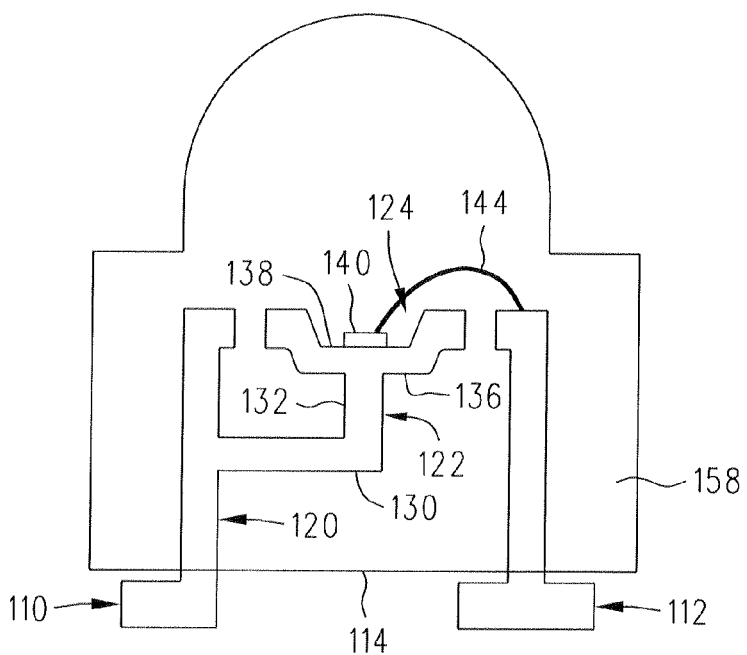
FIG. 2 is a side view of the light source of FIG. 1.

Additional reference is made to FIG. 2, which is a side view of the light source 100. Both the first lead frame assembly 110 and the second lead frame assembly 112 may extend from a mounting surface 114. The mounting surface 114 may support both lead frame assemblies 110, 112 and may contain or be in contact with an encapsulant as described below. In some embodiments, the light source 100 may not include a specific mounting surface 114. Rather, the mounting surface 114 may be a region from which the lead frame assemblies 110, 112 extend. The mounting surface 114 is used herein as a reference surface to describe the positions of the lead frame assemblies 110, 112.

The first lead frame assembly 110 has a first lateral side portion 120 that extends from the mounting portion 114. The first lateral side portion 120 is connected to a cup portion 124, sometimes referred to herein as cup 124. The first lateral side portion 120 may include an elongated trunk member 121 having a first end attached to the mounting surface 114 and a second end. The second end may be attached to the cup 124 directly or may be attached by a branching member 122. A second branching member 123 may also extend from the second end of the trunk member 121 as described further below. In some embodiments, the branching member 122 of the first lead frame assembly 110 of FIGS. 1 and 2 includes a horizontal section 130 and a vertical section 132, wherein the vertical section 132 is connected to the cup portion 124, as by elbow section 133.

The cup portion 124 has a first side 136, sometimes referred to as a cup portion first side 136 and a second side 138, sometimes referred to as a cup portion second side 138. In the embodiments of FIGS. 1 and 2, the first side 136 is located opposite the second side 138. As shown in FIGS. 1 and 2, the cup portion is connected to the branching member 122 of the first lead frame assembly 110. More specifically, the cup portion is connected to an elbow portion 133 of the vertical section 132 of the branching portion 122 of the first lead frame assembly 110. The second side 138 of the cup portion 124 is configured to receive or hold a light emitter, such as a light-emitting diode (LED) 140. The LED 140 may be adhered or bonded to the second side 138 of the cup portion 124 using conventional techniques. A wire 144 connects the LED 140 to the second lead frame assembly 112. Thus, a closed circuit is created from the first lead frame assembly 110, to the LED 140, to the wire 144 and to the second lead frame assembly 112.

In the embodiment of the light source 100 of FIGS. 1 and 2, the first lead frame assembly 110 includes a second lateral side portion 139, which may be a mirror image of the first lateral side portion 120 and which may be connected to a second end 143 of cup portion 124, such that cup portion 124 is supported at either end by lateral side portions 120, 139. The first lead frame assembly 110 also includes an extension member 150, sometimes referred to herein as a cross member. The extension member 150 may provide structural support within the light source 100. The extension member 150 may be attached at one end to second branch member 123 elbow portion 125. The other end of extension member 150 may be similarly attached to the second lateral side portion 139. The first lead frame assembly first and second lateral side portions 120, 139 and the extension member 150 will be collectively referred to herein as a cup support frame. It is noted that, with the embodiments of the light source 100 of FIGS. 1 and 2, the extension member 150 does not connect to the cup portion 124. It is noted that conventional light sources are configured so that the extension member connects to the cup portion and there are no other connections. Accordingly, in conventional light sources, the extension member is the only component connecting the first lead frame to the cup portion. As described below, the configuration of conventional light sources allows the first lead frame to flex, which causes substantial movement of the cup portion. The flexing damages the light source as described below.

The second lead frame assembly 112 may include first and second elongated trunk members 160, 162 which may be positioned in generally planar alignment with first lead frame first and second lateral side portions 120, 139, respectively. A cross member 164 may be attached to a top end of each trunk member 160, 162, such that cross member 164 is positioned at the same elevation as cup portion 124, in close, spaced apart relationship therewith.

The lead frame assemblies 110, 112 and other components within the light source 100 are encapsulated by an encapsulant 158. The encapsulant 158 serves to keep contaminants from damaging or degrading the components of the light source 100. For example, the encapsulant keeps the lead frame assemblies 110, 112, the LED 140, and the wire 144 from being exposed to corrosive materials and corroding. In addition, the encapsulant 158 keeps the LED 140 and the wire 144 from being damaged by preventing them from contacting other objects. The encapsulant 158 adheres to the components and may be, among other compounds, an epoxy or silicone.

Delamination of the encapsulant 158 within the light source 100 can cause failure of the light, source 100. Likewise, cracking of the encapsulant 158 may cause failure of the light source 100. Either situation may enable contaminants to enter the light source 100. In addition, delamination or cracking may cause the wire 144 to disconnect from the LED 140 or the second lead frame assembly 112, which will cause the light source 100 to fail. Delamination or cracking may also cause the LED 140 to lift from the cup 124. Either the broken wire 144 or lifting of the LED 140 will cause an open circuit, which will cause the light source 100 to fail.

One cause of cracking and/or delamination in conventional light sources is due to stresses created by thermal expansion and contraction. As stated above, conventional light sources attach the cup portion, or its equivalent, to the extension member, or its equivalent. In some embodiments, the cup portion extends a distance from the lead frame via a member or the like. The conventional light sources do not have first and second lateral side portions 120, 139 of a first lead frame assembly attached to opposite ends of the cup portion 124, as described above. The configuration of conventional light sources causes the cup portion to be on a cantilever relative to the first lead frame. This cantilever increases the flex of the first lead frame to the cup portion, which increases the amount of movement of the cup portion when it undergoes thermal expansion and contraction. This movement in conventional light sources is relatively large in the region of the cup portion and the second lead frame, which causes cracks and delmanination of the encapsulant in this region. Accordingly, conventional light sources are subject to failure by the wire breaking, the LED being removed from the cup portion, and other problems associated with delamination and cracked encapsulant.

The light source 100 described herein provides more stable components, which reduces the possibility of delamination or cracking of the encapsulant 158 due to movements of the components. As shown in FIGS. 1 and 2, the cup portion 124 is supported at either end by lateral side portions 120, 139 of the first lead frame assembly 110. Therefore, when the light source 100 is subjected to thermal stresses or other forces that cause flexing within the light source 100, the cup portion 124 may move a small amount relative to a cup portion of a conventional light source. The minimal movement of the cup portion 124 keeps the encapsulant from delaminating or cracking, which prevents the above-described problems.

Figure 3:
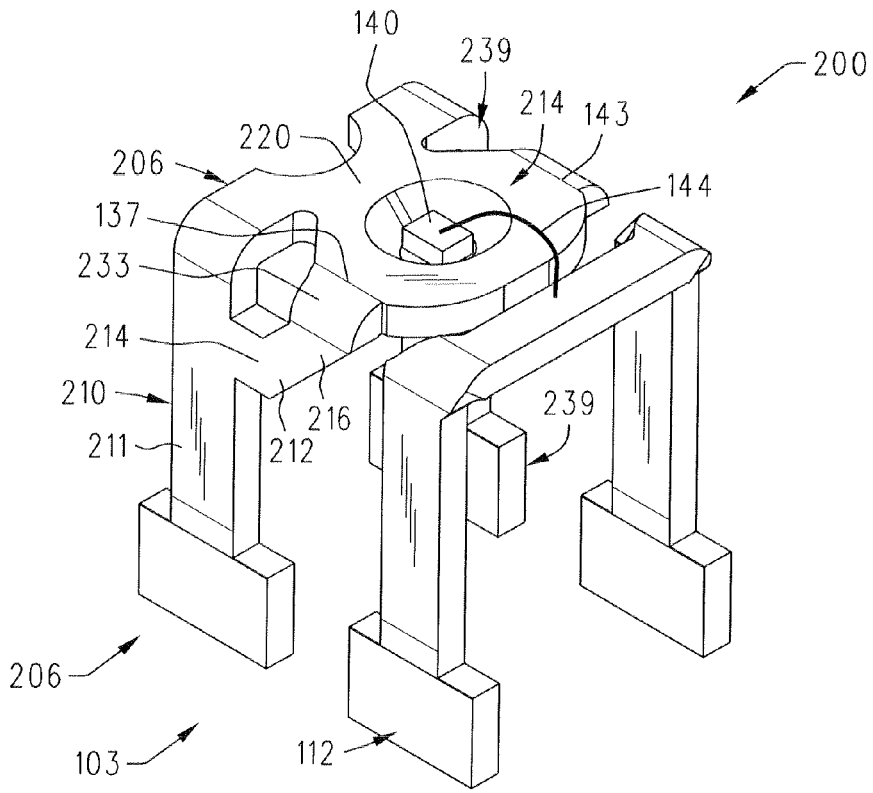
FIG. 3 is a top perspective view of a portion of a second embodiment of a light source with the encapsulant removed.
Figure 4:
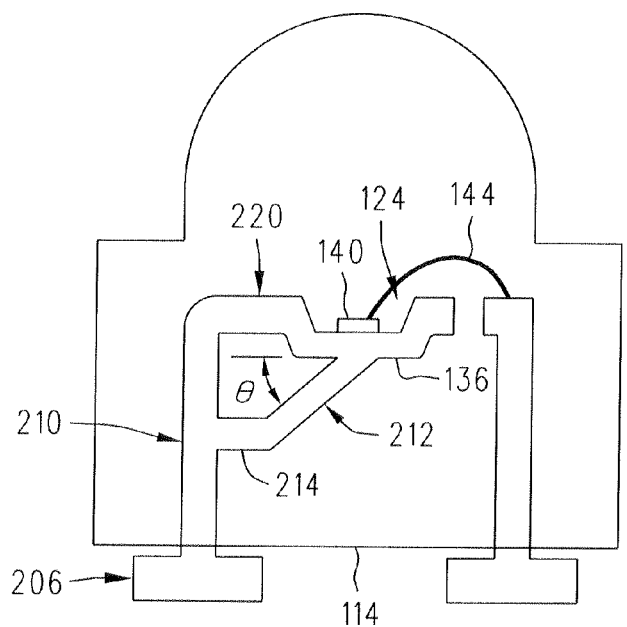
FIG. 4 is a side view of the light source of FIG. 3.

A second embodiment of the light source is shown in FIGS. 3 and 4 and is referenced as the light source 200. The light source includes a lead frame 103 with a second lead frame assembly 112, an LED 140, and a wire 144 that are substantially the same as those used in the light source 100 of FIGS. 1 and 2. However, the light source 200 includes a first lead frame assembly 206 that differs from the lead frame assembly 110 of FIGS. 1 and 2.

The lead frame assembly 206 has a first lateral side portion 210 with a trunk portion 211 that extends substantially perpendicular relative to the mounting surface 114. A branch portion 212 extends from the trunk portion 210. In the embodiments of FIGS. 3 and 4, the branch portion 212 includes a horizontal section 214 and an angled section 216. The angled section connects, as by elbow 233, to one peripheral end 137 of the cup portion 124 at an angle θ. The angle θ is determined by design criteria. In some embodiments, the branch portion 212 is a single member that connects between the trunk portion 210 and the first end 137 of the cup portion 124. The branch portion 212 serves as a support to keep the cup portion 124 from moving in order to reduce the likelihood that the encapsulant delaminates or cracks. The second peripheral end 143 of cup portion 124 is supported by a first lead frame assembly second lateral side portion 239, which may be a mirror image of the first lateral side portion 210.

In the embodiment of FIGS. 3 and 4, the light source 200 also includes a horizontal portion 220 that connects the top of the first lateral side portion 210 and the second lateral side portion 239 to the cup portion 214. The horizontal portion 220 is connected to the periphery of the cup portion 214 in the embodiment of FIGS. 3 and 4, however, the horizontal portion 220 could connect to other regions of the cup portion 214. The combination of the branch portions 212 of the two first lead frame lateral side portions 210, 239 and the horizontal portion 220 serve to stabilize the cup portion 214 when the light source 200 is subjected to thermal stresses and other forces that cause flexing within the light source 200.

What is claimed is:

1. A light source comprising:
   a mounting surface;
   a first lead frame assembly comprising:
      a cross member;
      a cup support frame extending from the mounting surface; and
      a cup, the cup support frame being connected to the cup at least two spaced apart portions thereof;
      wherein the support frame comprises parallel first and second trunk members extending from the mounting surface;
      wherein the first trunk member having first trunk branching members branching from an end portion of the first trunk member;
      wherein the first trunk branching members comprising a first trunk first branching member connected to the cup at one of the at least two spaced apart portions thereof;
      wherein the first trunk branching members comprising a first trunk second branching member connected to the cross member; and
      wherein the cup comprises a periphery and the at least two spaced apart portions of the cup comprise two diametrically opposed portions of the cup periphery and a third portion of the cup periphery, the third portion of the cup periphery being connected to the cross member;
   a second lead frame assembly spaced apart from the first lead frame assembly, comprising:
      parallel elongate members extending from the mounting surface; and
      a cross member connected to end portions of the elongate members;
   a light-emitting diode mounted in the cup; and
   an electrical connector electrically connecting the light-emitting diode to the second lead frame assembly, wherein the electrical connector is connected to the cross member.

2. A light source comprising:
   a mounting surface; and
   a first lead frame assembly comprising:
      a first lead frame assembly first lateral side portion attached to the mounting surface;
      a first lead frame assembly second lateral side portion attached to the mounting surface;
      a cup configured to receive a light emitting diode at an upper surface thereof, the cup having a first end connected to the first lead frame assembly first lateral side portion and a second end connected to the first lead frame assembly second lateral side portion; and
      a cross member having a first end connected to the first lead frame assembly first lateral side portion and having a second end connected to the first lead frame assembly second lateral side portion;

wherein the first lead frame assembly first lateral side portion comprises:
- a first trunk member extending upwardly from the mounting surface;
- a first branching member connected to the first trunk member and connected to the cup first end; and
- a second branching member connected to the trunk member and connected to the cross member first end.

3. The light source of claim 2 wherein the first lead frame assembly second lateral side portion is a mirror image of the first lead frame assembly second lateral side portion.

4. The light source of claim 2 comprising a second lead frame assembly comprising:
- a second lead frame assembly first trunk member attached to the mounting surface;
- a second lead frame assembly second trunk member attached to the mounting surface; and
- a second lead frame assembly cross member having a first end connected to the second lead frame assembly first trunk member and having a second end connected to the second lead frame assembly second trunk member;
- wherein the cup has a light emitting diode mounted therein which is electrically connected to the second lead frame assembly.

5. The light source of claim 2 wherein the cup is connected to the cross member at a peripheral portion thereof.

6. A light source comprising:
- a mounting surface;
- a first lead frame assembly comprising:
  - a first lead frame assembly first lateral side portion attached to the mounting surface; and
  - a first lead frame assembly second lateral side portion attached to the mounting surface;
  - a cup configured to receive a light emitting diode at an upper surface thereof, the cup having a first end connected to the first lead frame assembly first lateral side portion and a second end connected to the first lead frame assembly second lateral side portion; and
  - a cross member having a first end connected to the first lead frame assembly first lateral side portion and having a second end connected to the first lead frame assembly second lateral side portion;
- wherein the first lead frame assembly first lateral side portion comprises:
  - a first trunk member extending upwardly from the mounting surface;
  - a first branching member connected to the first trunk member and connected to the cup first end; and
  - a second branching member connected to the first trunk member and connected to the cross member first end;
- a second lead frame assembly comprising:
  - a second lead frame assembly first trunk member attached to the mounting surface;
  - a second lead frame assembly second trunk member attached to the mounting surface; and
  - a second lead frame assembly cross member having a first end connected to the second lead frame assembly first trunk member and having a second end connected to the second lead frame assembly trunk member.

7. The light source of claim 6 comprising a light emitting diode mounted in the cup and electrically connected to the second lead frame by a wire.

8. The light source of claim 7 comprising encapsulant encapsulating the first lead frame assembly, the second lead frame assembly, the light emitting diode and the wire.

* * * * *